United States Patent
Ohno et al.

(10) Patent No.: US 11,081,318 B2
(45) Date of Patent: Aug. 3, 2021

(54) GEOMETRICALLY SELECTIVE DEPOSITION OF DIELECTRIC FILMS UTILIZING LOW FREQUENCY BIAS

(71) Applicant: Applied Materials, Inc., Santa Clara, CA (US)

(72) Inventors: Kenichi Ohno, Sunnyvale, CA (US); Keiichi Tanaka, San Jose, CA (US); Li-Qun Xia, Cupertino, CA (US); Tsutomu Tanaka, Santa Clara, CA (US); Dmitry A. Dzilno, Sunnyvale, CA (US); Mario D. Silvetti, Morgan Hill, CA (US); John C. Forster, Mt. View, CA (US); Rakesh Ramadas, Santa Clara, CA (US); Mike Murtagh, Santa Clara, CA (US); Alexander V. Garachtchenko, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 60 days.

(21) Appl. No.: 16/220,833

(22) Filed: Dec. 14, 2018

(65) Prior Publication Data
US 2019/0189400 A1  Jun. 20, 2019

Related U.S. Application Data

(60) Provisional application No. 62/599,688, filed on Dec. 16, 2017.

(51) Int. Cl.
*H01L 21/31* (2006.01)
*H01J 37/32* (2006.01)
(Continued)

(52) U.S. Cl.
CPC .. *H01J 37/32385* (2013.01); *C23C 16/45519* (2013.01); *C23C 16/45544* (2013.01);
(Continued)

(58) Field of Classification Search
CPC ......... H01L 21/68764; H01L 21/68771; C23C 16/45519; C23C 16/45536;
(Continued)

(56) References Cited

U.S. PATENT DOCUMENTS

2011/0195577 A1    8/2011  Kushibiki et al.
2012/0247677 A1*  10/2012  Himori ............. H01J 37/32706
                                            156/345.44
(Continued)

FOREIGN PATENT DOCUMENTS

JP       2011165769 A      8/2011
KR    10-2010-0097865 A    9/2010
KR      20140007567 A  *   1/2014

OTHER PUBLICATIONS

PCT International Search Report and Written Opinion in PCT/US2018/065620 dated Apr. 11, 2019, 9 pages.

*Primary Examiner* — Brook Kebede
(74) *Attorney, Agent, or Firm* — Servilla Whitney LLC

(57) ABSTRACT

Apparatus and methods for depositing and treating or etching a film are described. A batch processing chamber includes a plurality of processing regions with at least one plasma processing region. A low frequency bias generator is connected to a susceptor assembly to intermittently apply a low frequency bias to perform a directional treatment or etching the deposited film.

20 Claims, 11 Drawing Sheets

(51) Int. Cl.
  *C23C 16/507* (2006.01)
  *C23C 16/455* (2006.01)
  *C23C 16/56* (2006.01)

(52) U.S. Cl.
  CPC ............ *C23C 16/507* (2013.01); *C23C 16/56* (2013.01); *H01J 37/3244* (2013.01); *H01J 37/32091* (2013.01); *H01J 37/32568* (2013.01); *H01J 2237/332* (2013.01); *H01J 2237/3341* (2013.01)

(58) Field of Classification Search
  CPC ........ C23C 16/45544; C23C 16/45551; C23C 16/4584; C23C 16/507; C23C 16/56; H01J 37/32091; H01J 37/3244; H01J 37/32568; H01J 2237/332; H01J 2237/3341; H01J 37/32385
  USPC .......................................................... 438/761
  See application file for complete search history.

(56) References Cited

U.S. PATENT DOCUMENTS

| | | | | |
|---|---|---|---|---|
| 2013/0143415 A1* | 6/2013 | Yudovsky | ......... | C23C 16/45551 438/765 |
| 2015/0275364 A1* | 10/2015 | Thompson | ........ | C23C 16/45544 427/532 |
| 2016/0104613 A1* | 4/2016 | Takeshita | .......... | H01L 21/02274 438/703 |
| 2016/0217999 A1* | 7/2016 | Sato | ...................... | C23C 16/403 |
| 2017/0213702 A1 | 7/2017 | Hammond, IV | | |
| 2017/0330744 A1 | 11/2017 | Keil et al. | | |

* cited by examiner

GEOMETRICALLY SELECTIVE DEPOSITION OF DIELECTRIC FILMS UTILIZING LOW FREQUENCY BIAS

CROSS-REFERENCE TO RELATED APPLICATIONS

This application claims priority to U.S. Provisional Application No. 62/599,688, filed Dec. 16, 2017, the entire disclosure of which is hereby incorporated by reference herein.

FIELD

Embodiments of the disclosure generally relate to an apparatus for processing substrates. More particularly, embodiments of the disclosure relate to apparatus and methods for depositing and selectively etching films with batch processing chambers.

BACKGROUND

The advancement of the microelectronics technology requires conformal films that cover exposed surfaces of the three-dimensional (3D) structures. The atomic layer deposition (ALD) technique of dielectric films, such as SiO, SiN and SiCN, has become an industry's choice for conformal coverage inside vias, contact holes, trenches and 3D NANDs to protect the structures from subsequence process steps.

Although ALD films are usually aimed for covering both horizontal and vertical surfaces, there is an emerging interest for selectively covering sidewalls of the structures while the top and bottom, or horizontal, surfaces are left uncovered, or vice versa, for covering only the horizontal plane while the sidewall is uncovered. Such techniques will enable selective modification of the underlying materials in the uncovered surfaces in subsequent processes while the covered planes are protected from materials or critical dimension (CD) change. For example, selective sidewall deposition in contact holes above epitaxial Si or SiGe enables silicidation of bottom Si or SiGe and following surface oxide removal while their sidewalls are protected through these processes.

Currently, to accomplish sidewall deposition, a conformal ALD film is deposited and subsequently undergoes a dry etch process ex-situ. However, several issues are identified in regard with this process flow. Amongst these issues are the fact that dry etch process cause device degradation via plasma damage due to difficult end point control for preventing from etching the bottom underlying layer. Additionally, current processes require expensive dry etch tools to achieve this process.

Therefore, there is a need in the art for apparatus and methods for selective sidewall deposition that minimizes additional equipment/steps and costs.

SUMMARY

One or more embodiments of the disclosure are directed to processing chambers comprising a susceptor assembly, a gas distribution assembly and a low frequency bias generator. The susceptor assembly has a top surface and a central axis to rotate a plurality of substrates positioned on the top surface around the central axis of the susceptor assembly. The gas distribution assembly comprises a plurality of processing regions, each processing region separated from adjacent processing regions by a gas curtain, at least one of the processing regions comprises a plasma processing region with a main deposition generator operating at a main deposition generator frequency. The low frequency bias generator is electrically connected to the susceptor assembly to apply a low frequency bias to the susceptor assembly.

Additional embodiments of the disclosure are directed to methods of depositing a film. The methods comprise: positioning at least one substrate on a top surface of a susceptor assembly; providing flows of gases into a plurality of processing regions, each processing region separated from adjacent processing regions by a gas curtain, the plurality of processing regions comprising a plurality of thermal processing regions with at least one of the plurality of processing regions being a plasma processing region with a main deposition generator connected thereto; providing power to the main deposition generator to form a plasma in the plasma processing region; and providing power to a low frequency bias generator electrically connected to the susceptor assembly to apply a low frequency bias to the susceptor assembly.

Further embodiments of the disclosure are directed to methods of depositing a film. The methods comprise positioning at least one substrate on a top surface of a susceptor assembly in a processing chamber. A substrate surface is exposed to a first number of deposition cycles, each deposition cycle comprises exposing the substrate surface to a first reactive gas in a first processing region of the processing chamber, moving the substrate surface from the first processing region through a gas curtain to a second processing region, exposing the substrate surface to a second reactive gas in the second processing region, moving the substrate surface from the second processing region through a gas curtain to a plasma processing region, and exposing the substrate surface to a plasma process in the plasma processing region. The substrate surface is exposed to a second number of treatment cycles, each treatment cycle comprising providing a low frequency bias to the susceptor assembly, and exposing the substrate surface to a biased plasma process in a biased plasma processing region using a main frequency plasma generated with a main deposition generator with the low frequency bias applied to the susceptor assembly.

BRIEF DESCRIPTION OF THE DRAWINGS

So that the manner in which the above recited features of embodiments of the disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
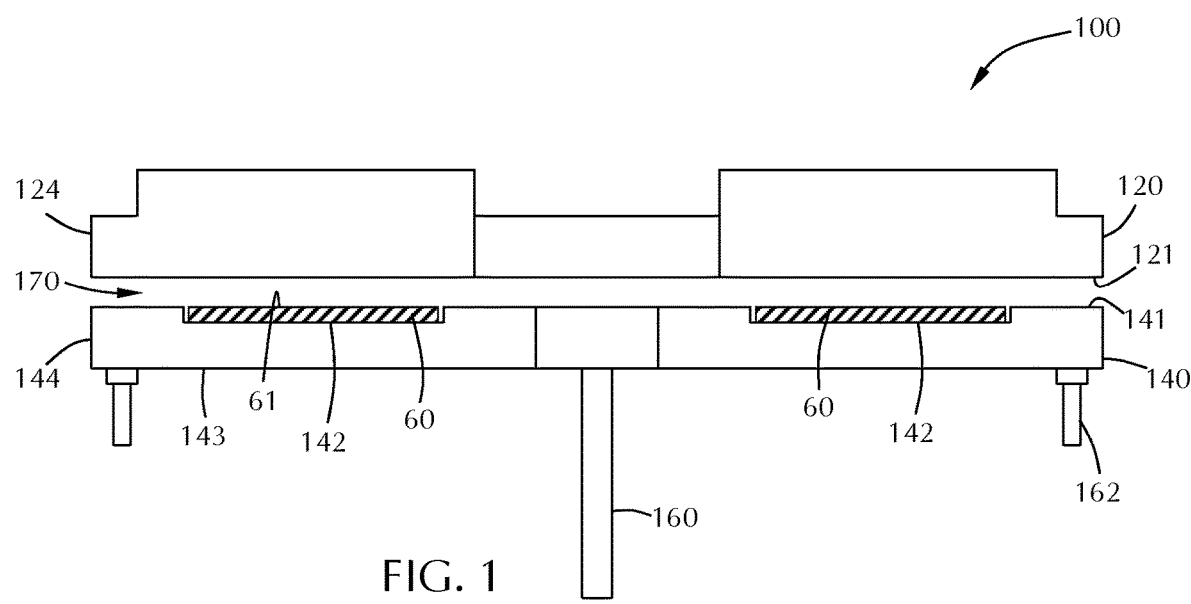
FIG. 1 shows a schematic cross-sectional view of a substrate processing system in accordance with one or more embodiments of the disclosure.

Embodiments of the disclosure provide a substrate processing system for continuous substrate deposition to maximize throughput and improve processing efficiency. The substrate processing system can also be used for pre-deposition and post-deposition plasma treatments.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

As used in this specification and the appended claims, the term "reduced pressure" means a pressure less than about 100 Torr, or less than about 75 Torr, or less than about 50 Torr, or less than about 25 Torr. For example, "medium pressure" defined as in the range of about 1 Torr to about 25 Torr is reduced pressure.

Rotating platen chambers are being considered for many applications. In such a chamber, one or more wafers are placed on a rotating holder ("platen"). As the platen rotates, the wafers move between various processing areas. For example, in ALD, the processing areas would expose the wafer to precursors and reactants. In addition, plasma exposure may be used as a reactant or to treat the film or the substrate surface for enhanced film growth or to modify film properties. Some embodiments of the disclosure provide for uniform deposition and post-treatment (e.g., densification) of ALD films when using a rotating platen ALD chamber.

Rotating platen ALD chambers can deposit films by traditional time-domain processes where the entire wafer is exposed to a first gas, purged and then exposed to the second gas, or by spatial ALD where portions of the wafer are exposed to the first gas and portions are exposed to the second gas and the movement of the wafer through these gas streams deposits the layer.

As used in this specification and the appended claims, the terms "pie-shaped" and "wedge-shaped" are used interchangeably to describe a body that is a sector of a circle. For example, a wedge-shaped segment may be a fraction of a circle or disc-shaped structure and multiple wedge-shaped segments can be connected to form a circular body. The sector can be defined as a part of a circle enclosed by two radii of a circle and the intersecting arc. The inner edge of the pie-shaped segment can come to a point or can be truncated to a flat edge or rounded. In some embodiments, the sector can be defined as a portion of a ring or annulus.

The path of the substrates can be perpendicular to the gas ports. In some embodiments, each of the gas injector assemblies comprises a plurality of elongate gas ports which extend in a direction substantially perpendicular to the path traversed by a substrate, where a front edge of the gas ports is substantially parallel to the platen. As used in this specification and the appended claims, the term "substantially perpendicular" means that the general direction of movement of the substrates is along a plane approximately perpendicular (e.g., about 45° to 90°) to the flow of gases from the gas ports. For a wedge-shaped gas port, the elongate axis of the gas port can be considered to be a line defined as the mid-point of the width of the port extending along the length of the port from the inner edge (narrow edge) to the outer edge (wider edge) of the wedge-shaped gas port.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
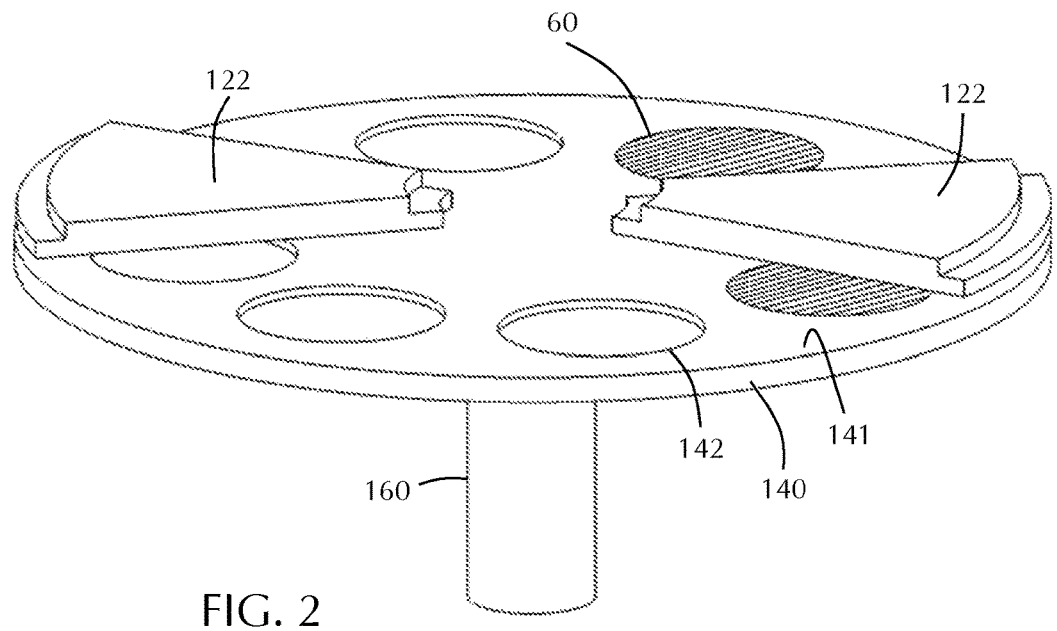
FIG. 2 shows a perspective view of a substrate processing system in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm. The recess 142 of some embodiments supports a wafer so that the inner diameter (ID) of the wafer is located within the range of about 170 mm to about 185 mm from the center (axis of rotation) of the susceptor. In some embodiments, the recess 142 supports a wafer so that the outer diameter (OD) of the wafer is located in the range of about 470 mm to about 485 mm from the center (axis of rotation) of the susceptor.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
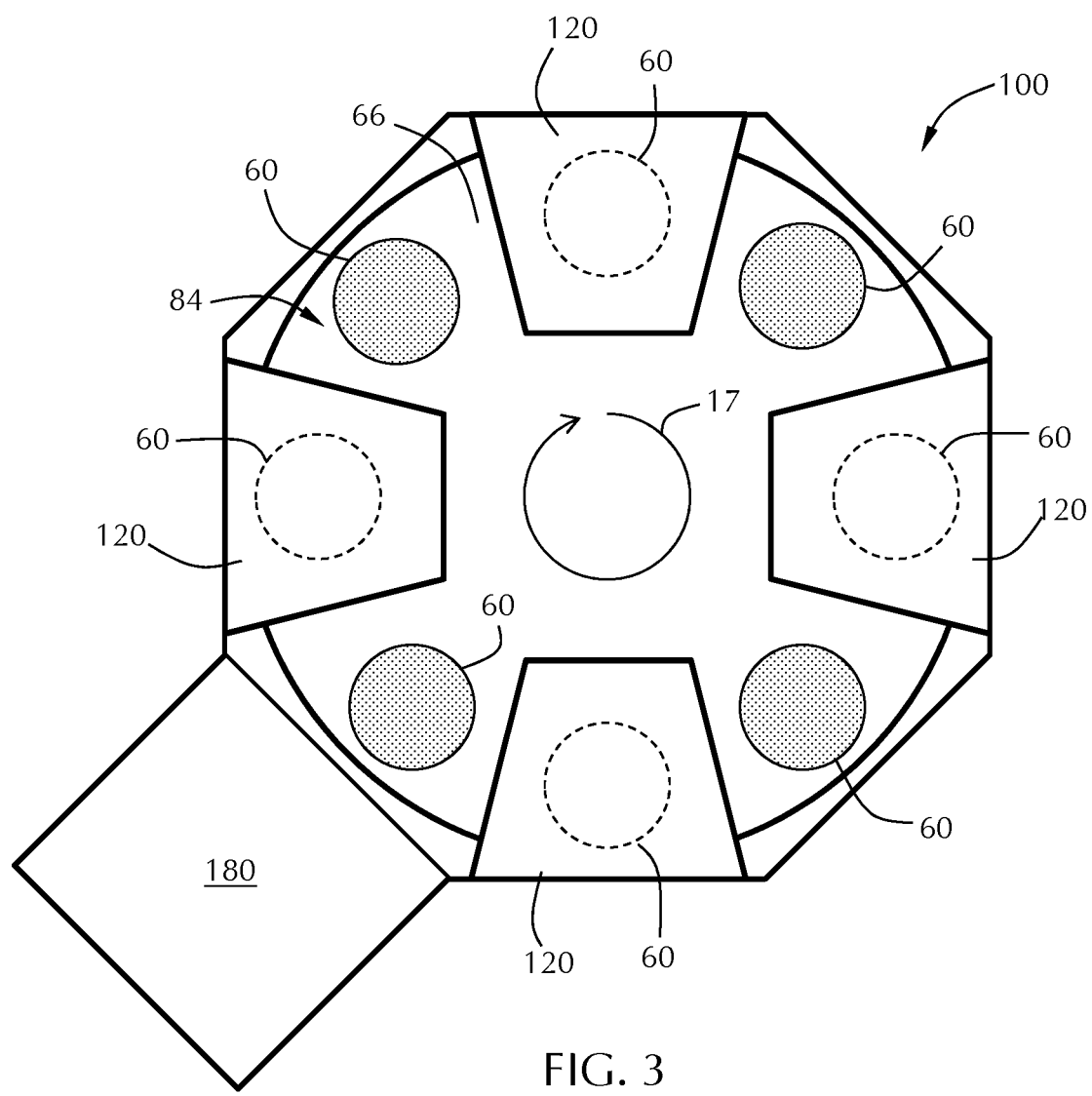
FIG. 3 shows a schematic of a substrate processing system in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the gas distribution assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal, however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
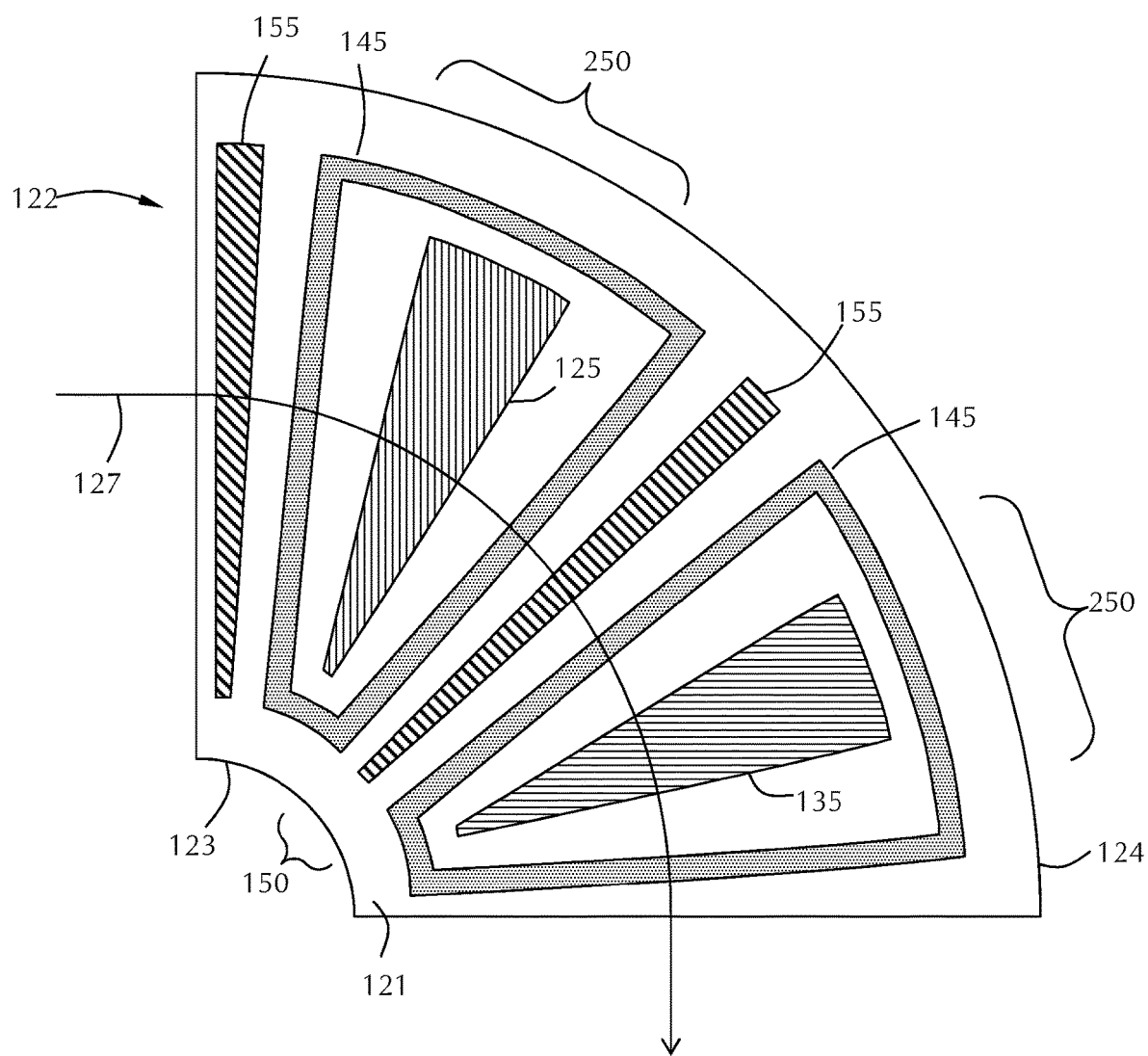
FIG. 4 shows a schematic view of a front of a gas distribution assembly in accordance with one or more embodiment of the disclosure.
Figure 5:
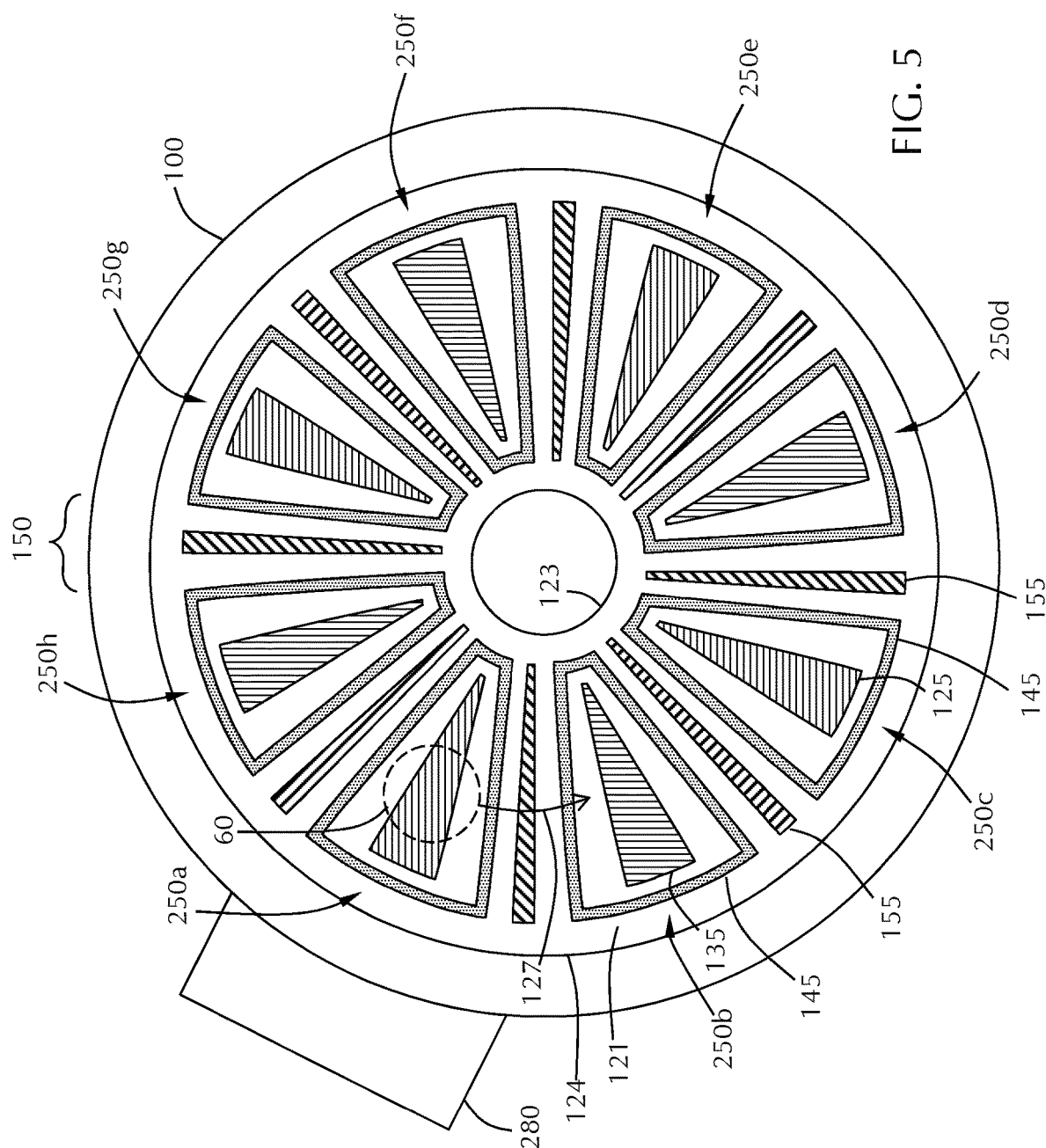
FIG. 5 shows a schematic view of a processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145 and vacuum ports 155 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first processing region 250a through the eighth processing region 250h, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance. The inventors have also discovered that the reaction process to create SiCN, SiCO and SiCON films, as described herein, could not be accomplished with a time-domain process. The amount of time used to purge the processing chamber results in the stripping of material from the substrate surface. The stripping does not happen with the spatial ALD process described because the time under the gas curtain is short.

Referring to FIGS. 6 through 14B, one or more embodiments of the disclosure are directed to modular capacitively coupled plasma sources 300. As used in this specification and the appended claims, the term "modular" means that plasma source 300 can be attached to or removed from a processing chamber. A modular source can generally be moved, removed or attached by a single person.

Figure 6:
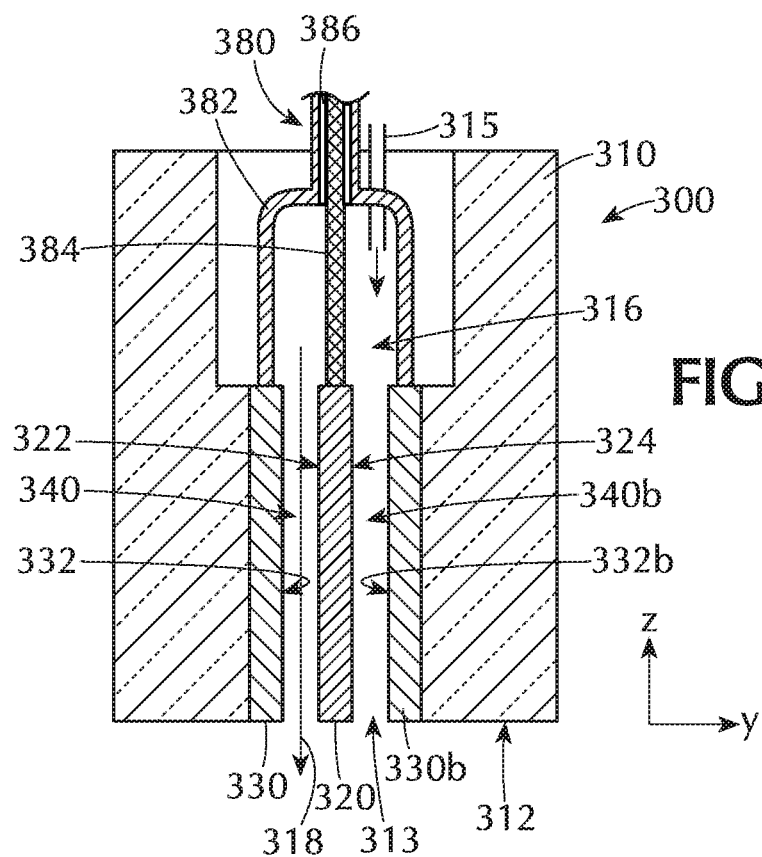
FIG. 6 shows a schematic cross-sectional view of a plasma source assembly in accordance with one or more embodiment of the disclosure.

FIG. 6 shows a cross-section of a plasma source assembly 300 in accordance with one or more embodiment of the disclosure. The plasma source assembly 300 shown in FIG. 6 includes a housing 310 with a gas inlet 315 and a front face 312. The gas inlet 315 allows a flow of gas to move along the flow path 318 through the housing 310 and out an opening 313 in the front face 312. The embodiment shown has a gas inlet 315 illustrated off-center for descriptive purposes, but those skilled in the art will understand that the gas inlet 315 can be centered in the housing 310. Additionally, some embodiments include a plenum 316 to increase the uniformity of the gas flow through the flow path 318. The plenum 316 of some embodiments is at least partially filled with a dielectric, which has a plurality of through holes and/or plenums to allow gas to reach the plasma cavity (gap 340, 340b) uniformly. The through holes and/or plenums have dimensions small enough to prevent plasma breakdown. In some embodiments, the through holes have diameters less than or equal to about 1 mm, 0.95 mm, 0.9 mm, 0.85 mm, 0.8 mm, 0.75 mm, 0.7 mm, 0.65 mm or 0.6 mm.

The plasma source assembly 300 includes an RF hot electrode 320 and at least one return electrode 330. The return electrode 330 is any conductive material that forms a complete circuit with the RF hot electrode 320. Those skilled in the art will understand that the return electrode 330 can provide a pathway for electrons to flow. The term "return" used in this manner means that the electrode is part of the electrical pathway of the plasma components and does not imply a direction for the flow of current or electrons.

Figure 7:
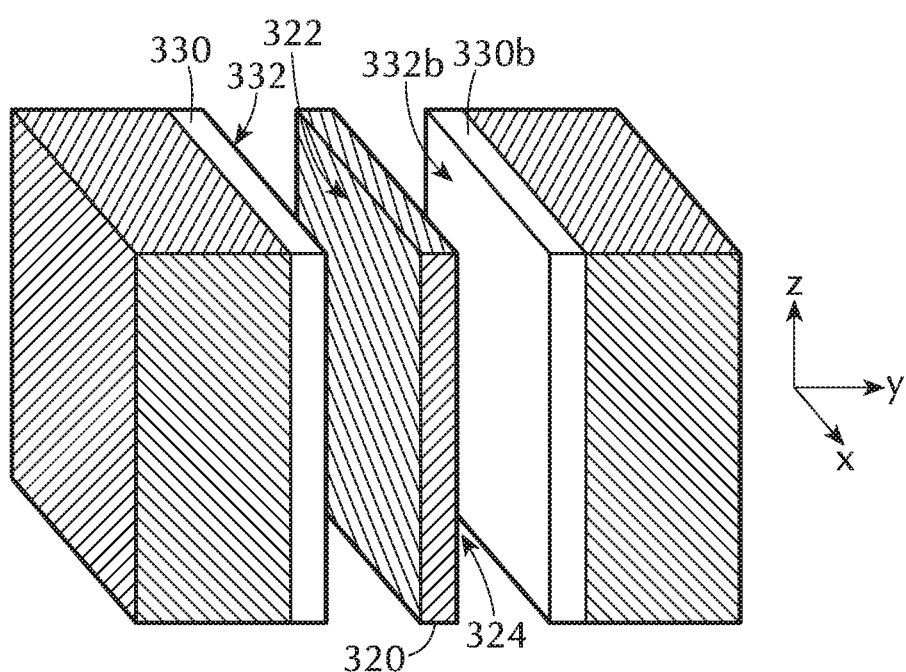
FIG. 7 shows a partial perspective view of a plasma source assembly in accordance with one or more embodiments of the disclosure.
Figure 8:
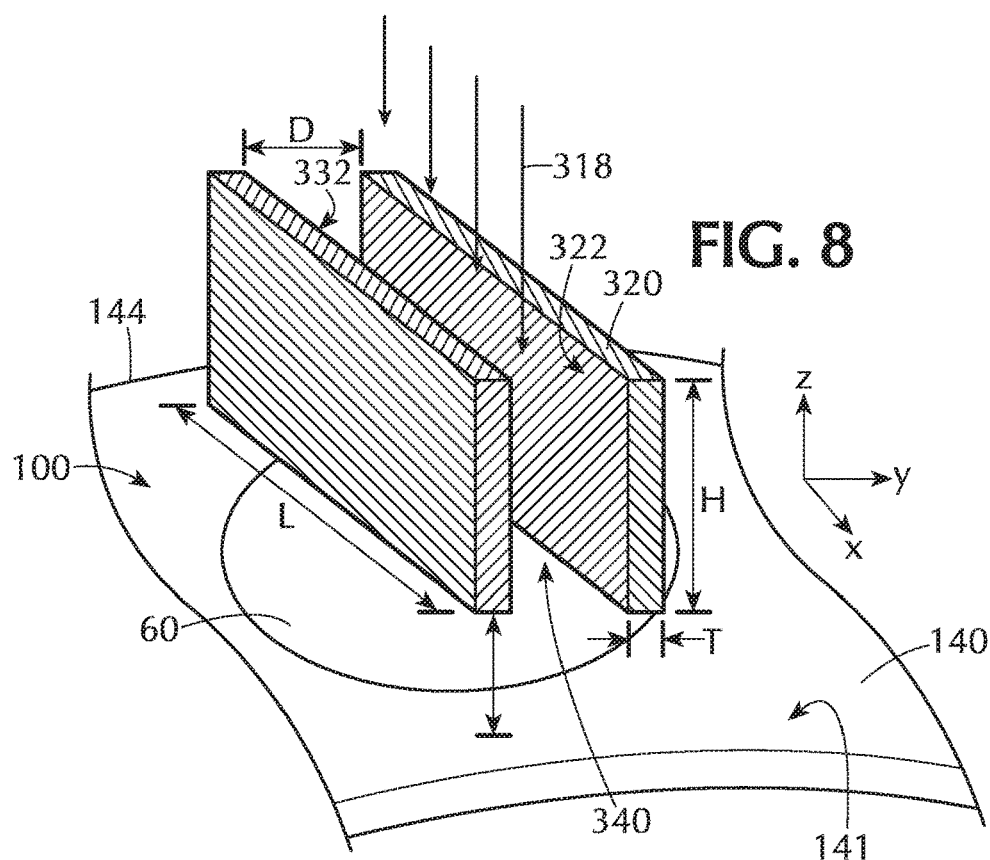
FIG. 8 shows a partial isometric view of a plasma source assembly in accordance with one or more embodiments of the disclosure.

Referring to FIGS. 6 to 8, the RF hot electrode 320 has a first surface 322 and a second surface 324 opposite the first surface 322. FIG. 6 shows a cross-section of a plasma source assembly 300 while FIGS. 7 and 8 show partial perspective views of the electrodes. As used in this regard, the first surface 322 and second surface 324 are on opposite sides of the thickness T of the RF hot electrode 320. The RF hot electrode 320 is a generally shaped as a rectangular prism with a height H, thickness T and length L. The RF hot electrode 320 has a first surface 322 oriented substantially parallel to the flow path 318. As used in this regard, the term "substantially parallel" means that the surface is within ±10° of parallel (defined as 0°).

The return electrode 330 is similarly shaped to the RF hot electrode 320. The return electrode has a first surface 332 that is oriented substantially parallel to the flow path 318. The first surface 332 of the return electrode 330 is spaced from the first surface 322 of the RF hot electrode 320 to form a gap 340.

The return electrode 330,330b can be any suitable material including, but not limited to, aluminum, stainless steel and copper. The return electrode 330, 330b can have any suitable electrical characteristics. In some embodiments, the return electrode 330, 330b is a ground electrode. A ground electrode is any conductive material in electrical contact with electrical ground.

In some embodiments, the return electrode 330, 330b is a powered electrode different from the RF hot electrode 320. As used in this manner, "different from the RF hot electrode" means that the electrical properties or potential are different from the RF hot electrode. For example, the driving power of the generated plasma may be tuned in a push-pull manner from a single source using a phase shifter to minimize interaction with the wafer. In embodiments of this sort, the RF hot electrode 320 may be, for example, 180° out of phase with the return electrode 330.

As shown in FIG. 7, some embodiments of the plasma source assembly further comprise a second return electrode 330b. The second return electrode 330b has a first surface 332b which is oriented substantially parallel to the flow path 318. The first surface 332b of the second return electrode 330b is spaced from a second surface 324 of the RF hot electrode 320 to form a gap 340b. The gap 340 and gap 340b can have the same or different dimensions. In some embodiments, the gap 340, 340b between the RF hot electrode 320 and the return electrode 330, 330b is in the range of about 4 mm to about 15 mm, or in the range of about 5 mm to about 14 mm, or in the range of about 7 mm to about 13 mm, or in the range of about 9 mm to about 12 mm, or about 11 mm.

The thickness T of the RF hot electrode 320 can be any suitable thickness depending on, for example, the electrode material. In some embodiments, the RF hot electrode has a thickness in the range of about 3 mm to about 11 mm, or in the range of about 4 mm to about 10 mm, or in the range of about 6 mm to about 9 mm or about 8 mm.

The height H of the RF hot electrode 320 can be varied. In some embodiments, the height H of the RF hot electrode 320 is in the range of about 8 mm to about 40 mm, or in the range of about 9 mm to about 35 mm, or in the range of about 10 mm to about 30 mm, or in the range of about 11 mm to about 25 mm, or in the range of about 12 mm to about 20 mm, or in the range of about 13 mm to about 15 mm or about 14 mm.

Figure 9:
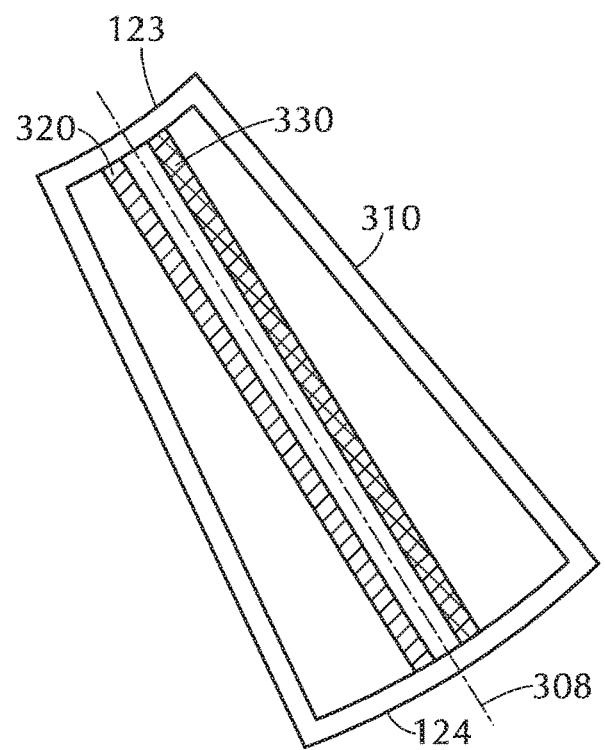
FIG. 9 shows a schematic bottom view of a plasma source assembly in accordance with one or more embodiments of the disclosure.

In some embodiments, the housing 310 of the plasma source assembly 300 is wedge-shaped. FIG. 9 shows an embodiment incorporating a wedge-shaped housing 310. As shown, the RF hot electrode 320 and the return electrode 330 extend along a major axis 308 of the housing 310. The major axis 308, as used in this manner, refers to the axis that extends through the middle of the arc forming the inner peripheral edge 123 and the middle of the arc forming the outer peripheral edge 124.

The spacing between the RF hot electrodes 320 and the return electrodes 330 can be substantially the same along the major axis 308 the plasma source assembly or can vary. For example, in some embodiments, the RF hot electrode and the return electrode are spaced further apart at the outer peripheral edge 124 of the wedge-shaped housing 310 than near the inner peripheral edge 123.

Figure 10:
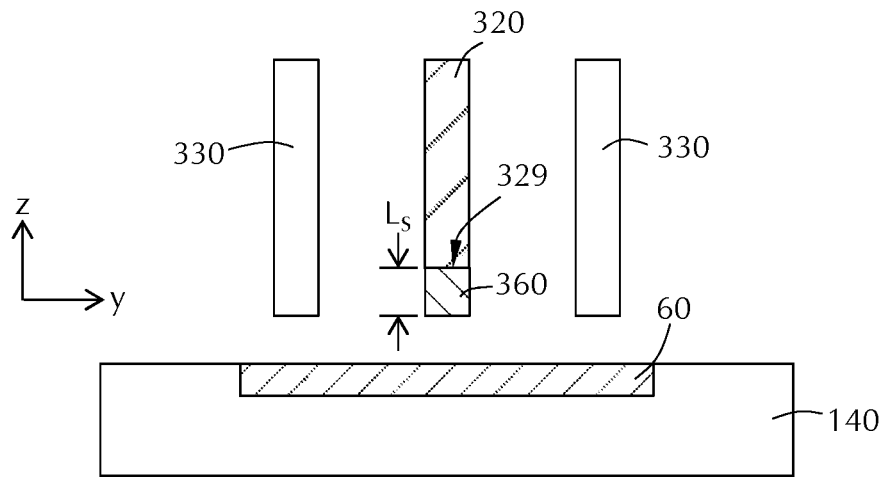
FIG. 10 shows a schematic side view of a plasma source assembly in accordance with one or more embodiments of the disclosure.

Some embodiments include a cladding 360 adjacent a lower edge 329 of the RF hot electrode 320. Referring to FIG. 10, the RF hot electrode 320 is illustrated between two return electrodes 330. A cladding 360 separates the lower edge 329 of the RF hot electrode 320 from the substrate 60 and susceptor assembly 140. The presence of the cladding 360, in some embodiments, helps prevent or minimize sputtering of the RF hot electrode 320 from contaminating the substrate 60. The cladding 360 can be made of any suitable material including, but not limited to, dielectrics (e.g., ceramic materials). The size of the cladding 360 can be adjusted to move the lower edge 329 of the RF hot electrode 320 from the vicinity of the substrate 60. In some embodiments, the cladding 360 has a length Ls in the range of about 10 mm to about 25 mm, or in the range of about 13 mm to about 20 mm or about 17 mm.

Figure 11:
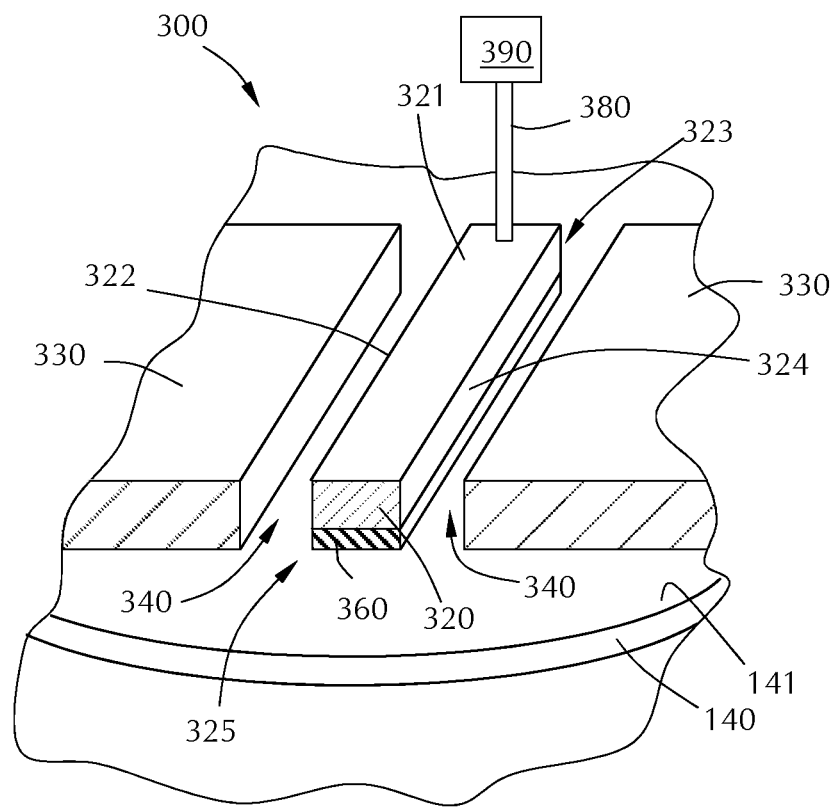
FIG. 11 shows a partial isometric view of a processing chamber with plasma source assembly in accordance with one or more embodiments of the disclosure.

Referring to FIGS. 1, 2, 8 and 11, some embodiments of the disclosure are directed to processing chambers 100 including a susceptor assembly 140 and a gas distribution assembly 120. FIG. 11 shows an isometric view of a processing chamber 100 in accordance with one or more embodiments of the disclosure. The susceptor assembly 140 has a top surface 141 to support and rotate a plurality of substrates 60 around a central axis 161.

The gas distribution assembly 120 has a front surface 121 facing the top surface 141 of the susceptor assembly 140 to direct a flow of gases toward the top surface 141 of the susceptor assembly 140. The gas distribution assembly 120 of some embodiments includes a plasma source assembly 300 with a wedge-shaped housing 310. The wedge-shaped housing has an inner peripheral edge 123 and an outer peripheral edge 124 defining a major axis 308 of the housing 310. The housing 310 has a first side 371, a second side 372, a gas inlet 315 and a front face 312. A flow path is defined as the path followed by a gas flowing from the gas inlet 315 through the housing 310 and exiting from the front face 312.

Figure 15:
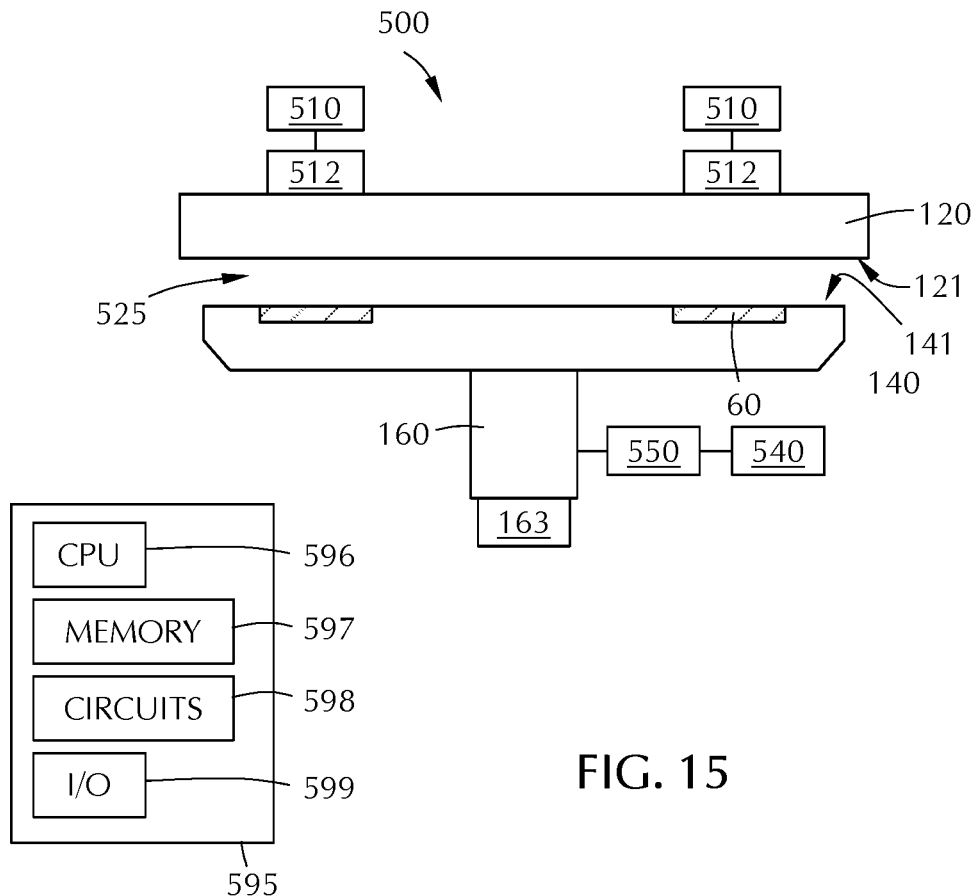
FIG. 15 shows a schematic cross-sectional view of a processing chamber in accordance with one or more embodiment of the disclosure.

The plasma source assembly 300 has at least one RF hot electrode 320 with a first surface 322 oriented substantially parallel to the flow path. In the embodiment shown, there are three RF hot electrodes 320. At least one return electrode 330 is within the housing 310 and has a first surface 332 oriented parallel to the flow path and spaced from the first surface 322 of the RF hot electrode 320 to form a gap 340. The front face 312 of the wedge-shaped housing 310 of the plasma source assembly 300 is positioned a distance from the top surface 141 of the susceptor assembly 140 in the range of about 1 mm to about 5 mm, or in the range of about 1.5 mm to about 4 mm, or about 2 mm. The embodiment shown in FIG. 15 is merely exemplary of one possible configuration of a processing chamber with a plasma source assembly and should not be taken as limiting the scope of the disclosure.

Referring back to FIG. 6, some embodiments include a coaxial RF feed line 380 that passes through the housing 310 and provides power for the RF hot electrode 320 to generate the plasma in the gap 340. The coaxial RF feed line 380 includes an outer conductor 382 and an inner conductor 384 separated by an insulator 386. The inner conductor 384 is in electrical communication with the RF hot electrode 320 and outer conductor 382 is in electrical communication with electrical ground or a different phase power source (not shown) than the RF hot electrode. As used in this specification and the appended claims, the term "electrical communication" means that the components are connected either directly or through an intermediate component so that there is little electrical resistance. The gap between inner conductor 384 and outer conductor 382 can be filled with a dielectric, which may be ceramic, but can be any suitable dielectric material.

The coaxial RF feed line 380 may be constructed so that the outer conductor 382 terminates on the return electrode 330. The inner conductor 384 can terminate on the RF hot electrode 320. In some embodiments, the gas inlet 315 is fed to the housing around the outside periphery of the coaxial feed. The RF feed may be in the form of a coaxial transmission line. The outer conductor can be connected/terminated in the return electrode, and the inner conductor is connected to the RF hot electrode. The return electrode 330 can be connected to the metal housing by any suitable method including, but not limited to, a metal gasket. This helps to ensure a symmetric geometry of the return currents. All return currents flow up the outer conductor of the feed, minimizing RF noise. In some embodiments, the RF feed is designed to provide symmetric RF feed current to the RF hot electrode, and symmetric return currents. All return currents flow up the outer conductor, minimizing RF noise, and minimizing impact of source installation on operation.

For a linear radial plasma source, like that shown in FIGS. 6-8, in any processing system that uses a rotating susceptor (platen), the plasma exposure (treatment) is greater at the inner diameter (ID) of the wafer compared to the outer diameter (OD) of the wafer. In a system with a coaxial feed connected to the approximate center of the hot electrode, the difference between the ID and OD exposure can be about 2.7 times. Currently, the coaxial feed is connected to the hot electrode at about the center of the electrode. This connection configuration may not provide uniform plasma exposure at the ID and OD of the wafer. One or more embodiments of the disclosure advantageously provide simple linear design plasma source. Some embodiments advantageously provide an inner diameter feed at high frequency or very high frequency with increasing plasma flux from the wafer ID to OD.

Figure 12:
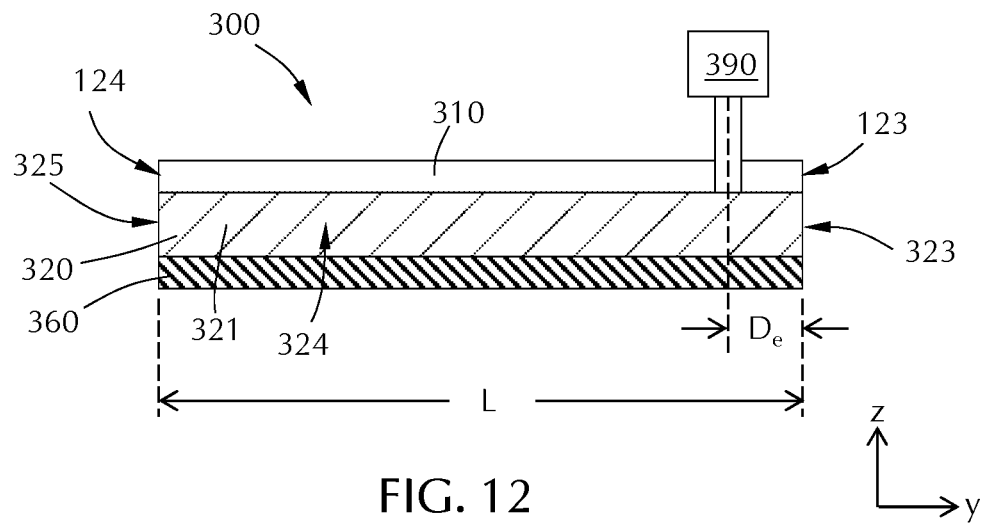
FIG. 12 shows a partial cross-sectional side schematic of a plasma source assembly electrodes in accordance with one or more embodiments of the disclosure.

Referring to FIGS. 11 and 12, the vertical plasma source (VPS) can be a linear plasma source with a powered electrode (hot electrode) and return electrode that extend from the ID to OD of the wafer and beyond. The gap between the hot electrode and return electrode can be substantially uniform along the length of the electrodes from the ID to OD.

The electrodes of some embodiments are enclosed by inner and outer cladding made from a dielectric material to minimize metal contamination. The "inner cladding" can be used to refer to the cladding associated with the RF hot electrode and the "outer cladding" can be used to refer to the cladding associated with the return electrode. A gap is maintained between the bottom of the cladding and the wafer/susceptor that exposes plasma to the wafer.

Generally, the electric field (and plasma flux) generated in a plasma assembly is greatest near the RF feed with field strength decreasing with distance from the RF feed. In the linear vertical plasma source, the minimum electric field and plasma density occurs surprisingly underneath the RF feed. Without being bound by any particular theory of operation, it is believed that this is due to electromagnetic effects which increase with the frequency of the RF power. The inventors have found that moving the RF feed toward the ID end of the hot electrode can compensate for the exposure non-uniformity.

The power source 390 can be operated at any suitable frequency. It has been found that higher frequency power may create a plasma density variation that can compensate for the differing exposure between the ID and OD due to susceptor rotation. In some embodiments, the power source 390 is operated at high frequency (20-30 MHz) or at very high frequency (30-100 MHz). In some embodiments, the power source 390 is operated at 60 MHz.

Figure 13:
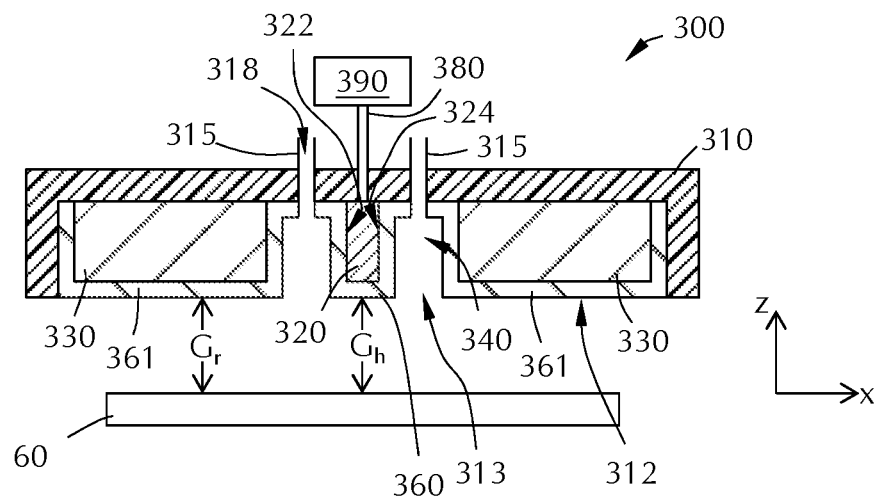
FIG. 13 shows a partial cross-sectional view of a plasma source assembly in accordance with one or more embodiments of the disclosure.

Referring to FIGS. 11 through 13, one or more embodiments of the disclosure is directed to a plasma source assembly 300. The plasma source assembly 300 includes a housing 310, shown in FIG. 13. The housing 310 of some embodiments holds or supports all of the components of the plasma source assembly except the power connection or gas line connections that might be used. Combined into one housing, the plasma source assembly can be modular; allowing the assembly to be moved, added to or removed from a processing apparatus. The housing 310 of some embodiments is wedge-shaped to fit into a gas distribution assembly 120 like that shown in FIG. 4 or 5. While the housing 310 may be wedge-shaped, the shape of the plasma cavity or gap in which the plasma is formed, can be linear. The embodiment illustrated in FIG. 11 does not show the housing for descriptive purposes.

FIG. 12 shows a partial cross-sectional side view of the plasma source assembly 300 of some embodiments. The housing 310 has an inner peripheral edge 123 and an outer peripheral end 124 that can be aligned with the gas distribution assembly 120 illustrated in FIGS. 4 and 5. As shown in FIG. 13, the housing 310 may include a gas inlet 315 to form a flow path 318 from the gas inlet 315 to allow a flow of gas to pass through the housing 310 and out an opening 313 in the front face 312 of the plasma source assembly 300. The front face 312 can be formed by the housing 310, the RF hot electrode 320, the return electrode 330, or any suitable material that can be positioned a distance from the susceptor assembly. In some embodiments, the front face 312 is formed from a combination of separate components resulting in a mixture of materials.

The plasma source assembly includes an RF hot electrode 320 with an elongate body 321 that includes a first surface 322 and a second surface 324 opposite the first surface 322. The first surface 322 and second surface 324 define the width of the RF hot electrode 320. In some embodiments, the first surface 322 and second surface 324 are substantially parallel. As used in this regard, the term substantially parallel means that the surfaces form major planes that are within ±10°, ±9°, ±8°, ±7°, ±6°, ±5°, ±4°, ±3°, ±2° or ±1° of being parallel. In some embodiments, the width of the RF hot electrode 320 is in the range of about 2 mm to about 20 mm, or in the range of about 3 mm to about 15 mm, or in the range of about 4 mm to about 10 mm, or in the range of about 5 mm to about 9 mm, or in the range of about 6 mm to about 8 mm, or about 7 mm.

The elongate body 321 of the RF hot electrode 320 has an inner peripheral end 323 and an outer peripheral end 325. The inner peripheral end 323 of the RF hot electrode 320 is positioned within the housing 310 near the inner peripheral edge 123 of the housing 310. The outer peripheral edge 325 of the RF hot electrode 320 is positioned within the housing 310 near the outer peripheral edge 124 of the housing 310. The inner peripheral end 323 and outer peripheral end 325 define a length L of the RF hot electrode 320. The embodiment illustrated in FIG. 12 shows the housing 310 having about the same length as the RF hot electrode 320. This is merely representative of one possible configuration and should not be taken as limiting the scope of the disclosure. The housing of some embodiments extends beyond the ends of the RF hot electrode and may wrap around at least some of the RF hot electrode. The length L of the RF hot electrode 320 of some embodiments is in the range of about 160 mm to about 440 mm. The length L of the RF hot electrode 320 can be configured to span the width of a substrate to be processed. For example, if the substrates being processed are 200 mm diameter wafers, the RF hot electrode can have a length L in the range of about 160 mm to about 440 mm, or in the range of about 180 mm to about 220 mm, or in the range of about 190 mm to about 210 mm, or in the range of about 195 mm to about 205 mm. If the substrates being processed are 300 mm diameter wafers, the RF hot electrode can have a length L in the range of about 160 mm to about 440 mm, or in the range of about 260 mm to about 440 mm, or in the range of about 280 mm to about 320 mm, or in the range of about 290 mm to about 310 mm, or in the range of about 295 mm to about 305 mm.

A return electrode 330 can be any component that is suitable to allow a return current to flow or provide an opposite polarity voltage from the RF hot electrode. The term "return electrode" is used to represent an electrical connection that forms a complete circuit with the RF hot electrode and should not be taken as implying a direction for a flow of current or electrons. The return electrode 330 of some embodiments is the housing 310. In some embodiments, the return electrode 330 is a separate component within the housing 310. The return electrode 330 can be made from the same material as the housing 310 but be electrically isolated from the housing 310, or the return electrode 330 can be made from a different material than the housing 310. In the embodiments illustrated, the return electrode 330 is a different material than the housing 310. The return electrode 330 of some embodiments has an elongate body that extends from the inner peripheral edge to the outer peripheral edge of the housing. The return electrode is spaced from the RF hot electrode 320 to provide a gap 340 in which a plasma can form.

An RF feed 380 connects a power source 390 to the RF hot electrode 320. The RF feed 380 can be a coaxial RF feed line, like that shown in FIG. 6. As illustrated in FIG. 12, the RF feed 380 connects to the RF hot electrode at a distance $D_e$ from the inner peripheral edge 323 of the RF hot electrode 320. The distance $D_e$ of some embodiments is less than or equal to about 25% of the length L of the RF hot electrode 320. In some embodiments, the distance $D_e$ is less than or equal to about 20%, 15%, 10%, 5%, 4%, 3%, 2% or 1% of the length L of the RF hot electrode 320.

As illustrated in FIG. 13, in some embodiments the RF hot electrode 320 has RF hot electrode cladding 360 positioned so that the RF hot electrode 320 is not exposed directly to the substrate or susceptor assembly. As used in this manner, the term "not exposed directly" and the like means that an atom ejected from the RF hot electrode 320 cannot travel a straight path to impact the surface of the substrate. In the embodiment shown, the RF hot electrode cladding 360 wraps around all exposed sides and surfaces of the RF hot electrode 320. The RF hot electrode cladding 360 of some embodiments comprises one or more of silicon or silicon oxide. In some embodiments, the RF hot electrode cladding 360 comprises or consists essentially of quartz. In some embodiments, the RF hot electrode cladding 360 is made from a material that is not sputtered as a contaminant on a wafer being processed. The RF hot electrode cladding 360 materials may depend on the process or deposition being performed.

In some embodiments, the return electrode 330 includes a return electrode cladding 361. The return electrode cladding 361 of some embodiments is positioned so that the return electrode 330 is not directly exposed to the substrate or susceptor surface. In some embodiments, the return electrode cladding 361 comprises one or more of silicon, silicon oxide or aluminum oxide.

The return electrode cladding 361 of some embodiments comprises a material that is different from the RF hot electrode cladding 360. In some embodiments, the RF hot electrode cladding 360 and the return electrode cladding 361 are made from the same material. In some embodiments, the RF hot electrode cladding 360 comprises quartz and the return electrode cladding comprises aluminum oxide. In some embodiments, the RF hot electrode cladding 360 consists essentially of quartz and/or the return electrode cladding consists essentially of aluminum oxide. As used in this manner, the term "consists essentially of" means that the composition of the subject cladding is greater than or equal to about 95%, 98% or 99% of the stated material on a weight basis.

The RF hot electrode cladding 360 and return electrode cladding 361 can form the front face 312 of the plasma source assembly 300. The distance $G_h$ from the RF hot electrode cladding 360 to the substrate 60 can be the same as or different from the distance $G_r$ from the return electrode cladding 361 to the substrate 60.

The plasma source assembly 300 of some embodiments provides a plasma with an ion flux generated at the inner peripheral end 323 of the RF hot electrode 320 that is less than an ion flux generated at the outer peripheral end 325 of the RF hot electrode 320.

Additional embodiments of the disclosure are directed to methods of processing a substrate. A substrate 60 is positioned on a susceptor assembly 140 adjacent a gas distribution assembly 120. The gas distribution assembly 120 includes a plasma source assembly in accordance with one or more embodiments of the disclosure. A gas is flowed through the gas inlet 315 of the housing 310 into the gap 340 between the RF hot electrode 320 and the return electrode 330. The RF hot electrode 320 is energized through the RF feed 380 positioned within 25% of the length L of the RF hot electrode 320 measured from the inner peripheral end 323 to form a plasma in the gap 340. The plasma flows out the front face 312 of the housing 310 to expose the substrate 60 to the plasma.

Figure 14A:
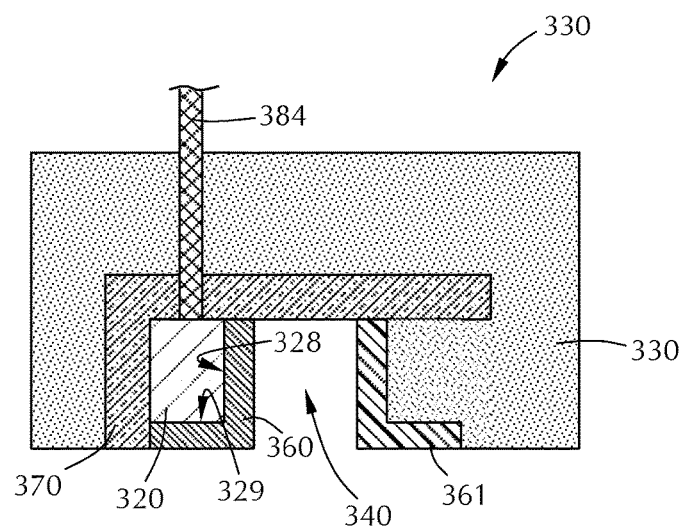
FIG. 14A shows a cross-sectional view of a plasma source assembly in accordance with one or more embodiments of the disclosure.
Figure 14B:
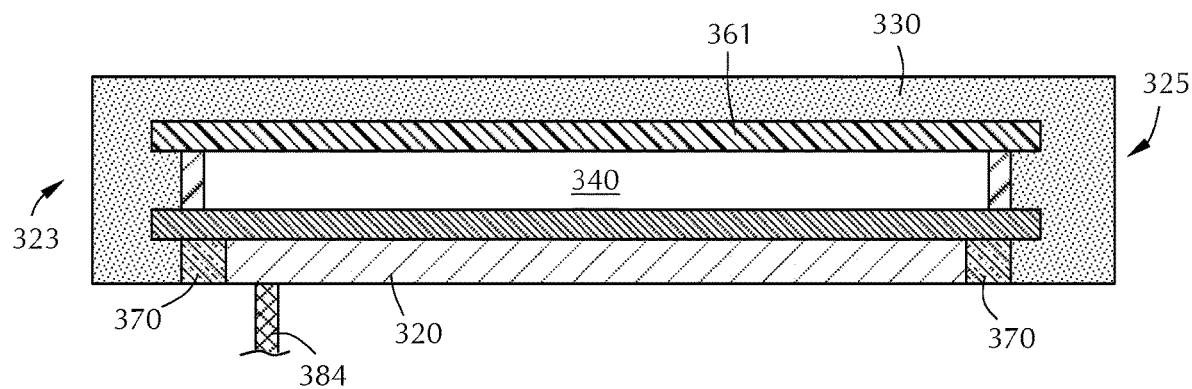
FIG. 14B shows a cross-sectional side view of a plasma source assembly in accordance with one or more embodiment of the disclosure.

FIGS. 14A and 14B show a cross-sectional view and a bottom view, respectively, of a plasma source assembly 300 in accordance with one or more embodiment of the disclosure. The plasma source assembly 300 includes an RF hot electrode 320 and a return electrode 330. In the illustrated embodiment, the return electrode 330 is the housing of the plasma source assembly 300. The RF hot electrode is isolated from the return electrode 330 by a dielectric 370. The inner conductor 384 of the coaxial feed line connects to the RF hot electrode 320 near the inner diameter end 323, relative to the outer diameter end 325.

In the illustrated embodiment, a cladding 360 is wrapped around the lower edge 329 and side edge 328 of the RF hot electrode 320. Along the length of the RF hot electrode 320, from the inner diameter end 323 to the outer diameter end 325, the cladding 360 shields the RF hot electrode 320 from adjacent components so that there is no direct line of sight between the RF hot electrode 320 and other components.

An outer cladding 361 is positioned on the return electrode 330 so that the outer cladding 361 is between the return electrode 330 and the gap 340. As shown, the outer cladding 361 can wrap around a front portion of the return electrode 330 to prevent sputtering of the return electrode.

Accordingly, embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. For example, if region 250a had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second reactive gas port 135.

The inert gas flow within the processing regions can be constant or varied. In some embodiments, the reactive gas is co-flowed with an inert gas. The inert gas will act as a carrier and diluent. Since the amount of reactive gas, relative to the carrier gas, is small, co-flowing may make balancing the gas pressures between the processing regions easier by decreasing the differences in pressure between adjacent regions.

In some embodiments, at least one of the processing region includes a plasma source assembly. Some embodiments use a remote plasma source in which a plasma can be created between a powered plate (RF hot electrode) and a group plate (return electrode). A gas species flows between the plates and is energized to form a plasma adjacent the surface of the susceptor assembly. The plasma can be substantially confined to the source and minimizes sputtered material from the powered plate reaching the wafer surface. Some embodiments also advantageously provide a soft plasma that does not substantially change of the substrate surface. One or more embodiments provide an apparatus that can generate a plasma without allowing the electrical return path to go through the substrate. Some embodiments of the disclosure provide modular remote plasma sources that can be added to or removed from a gas distribution assembly. The remote plasma source generates a plasma without using the substrate or substrate support as an electrode.

The gap between the RF hot electrode (the powered electrode) and the ground plate (referred to as a return electrode) can be varied. In some embodiments, the gap is in the range of about 3 mm to about 15 mm and may be adjustable. The width of the RF hot electrode can be varied. For example, the plates can be tapered to accelerate ions. In use, the gaseous species flowing in the gap between the RF hot electrode and the return electrode become ionized. The ionized species can then contact the substrate surface. In some embodiments, the plasma formed is a soft plasma that does not substantially change the substrate surface.

One or more embodiments of the disclosure are directed to selective sidewall deposition processes and apparatus. In some embodiments, a low-frequency (LF) bias capability adds directional bias to a plasma-enhanced atomic layer deposition (PE-ALD) batch processing tools. Applying LF bias to the susceptor may advantageously enable directionality of the flow of ions and radicals generated inside the plasma that modifies the film properties selectively on the horizontal surface. The geometrical dependence of the properties of the conformal film may enable the selective etch (or selective etch tolerance) of the horizontal-plane films during a subsequent wet etch process without adding significant cost. Some embodiments advantageously provide apparatus with in-situ LF bias capability to open the process window that flexibly optimizes film properties for various applications.

Referring to FIG. 15, some embodiments of the disclosure are directed to processing chambers 500. The processing chamber 500 contains one (or more) susceptor 140 to hold multiple substrates 60 that rotate around a shaft 160 and a motor 163 attached at the bottom of the chamber. The wafers are faced upward to an injector (gas distribution assembly 120) which contains multiple cells (gas ports) in an azimuthal direction. The gas flow of the each cell can be separately controlled by independent mass flow controllers (MFCs). Each cell is separated by a curtain of inert gas (e.g., nitrogen) flow in order to prevent mixture of gases from different cells. By rotating the susceptor, wafers are sequentially exposed to multiple precursors (gases) to establish ALD cycles. Some of the cells in the batch processing system can be configured as a radio-frequency (RF) plasma processing region by adding an RF generator 510 and a match circuit 512. Adding plasma exposure during the deposition may be useful to modulate the film property, either to improve its quality, or to intentionally degrade part of the film. The gas distribution assembly 120 comprises a plurality of processing regions (as seen in FIG. 5). Each of the processing regions is separated from adjacent processing regions by a gas curtain and at least one of the processing regions is a plasma processing region 525. The cross-sectional view shown in FIG. 5 includes two plasma processing regions 525 located on opposite sides of the processing chamber. For example, referring to the nomenclature of FIG. 5, the fourth processing region 250d and eighth processing region 250h can be plasma processing regions while the other processing regions are referred to as thermal processing regions. The use of the term "thermal processing region" merely means that there is no plasma in that region, no temperature is implied. The plasma processing region 525 includes the wedge-shaped sector of the gas distribution assembly 120 with the gas port bounded by the gas curtains.

A main deposition generator 510 is connected to the plasma processing region 525 through the match circuit 512. The main deposition generator 510 of some embodiments operates at a main deposition generator frequency. The main deposition generator frequency of some embodiments is greater than or equal to 2 MHz. In some embodiments, the main deposition generator frequency is about 13.56 MHz, 40 MHz, 60 MHz or 100 MHz. In some embodiments, the main deposition generator 510 applies power to the gas distribution assembly 120 and the susceptor assembly 140 acts as a return electrode. The main deposition generator 510 can be configured to apply sufficient energy to ignite a plasma in the plasma processing region 525 and not ignite a plasma in non-plasma processing regions (i.e., thermal processing regions).

In addition to the main deposition generators 510, a second "low frequency" bias generator 540 can be electrically connected to the susceptor assembly 140. In some embodiments, the low frequency bias generator 540 is connected to the susceptor assembly 140 through an interface box 550. The low frequency bias generator 540 is electrically connected to the susceptor assembly 120 to apply a low frequency bias to the susceptor assembly 120. The low frequency bias can be any suitable low frequency. In some embodiments, the low frequency bias is less than about 2 MHz, 1 MHz or 500 kHz. In some embodiments, the low frequency bias generator operates at a frequency of about 325 kHz.

In some embodiments, as shown in FIG. 15, the low frequency bias generator 540 is connected to the susceptor assembly 120 through an interface box 550. The function of the interface box 550 is described with respect to FIG. 16. The skilled artisan will recognize that not all of the listed functions and components may be included, or additional components and functions can be included. The embodiment illustrated is merely representative of one possible configuration. The interface box 550 can include DC isolation of the susceptor with a DC blocking capacitor 551. In some embodiments, RF filters 552a, 552b can be incorporated to block the main as well as the 2nd (and possibly $3^{rd}$) harmonics frequencies of the main generator RF, respectively. While two RF filters are illustrated, there can be more or less than two included depending on, for example, the number of harmonic frequencies to be blocked. In some embodiments, an additional low-pass filter 553 blocks RF power above the low bias frequency. In some embodiments, readout circuits for the susceptor DC voltage (Vdc) 554 and the low-frequency bias voltage (Vrms) 555 can output to an input/output 599 device (e.g., computer monitor).

The input power of the main frequency generator 510 is used to generate plasma inside the chamber. The second frequency from the low frequency bias generator 540, which is much lower than the main frequency (e.g. 325 kHz vs. 13.56 MHz), enhances the directionality of flows of the products generated in the plasma, such as ions and radicals. In some embodiments, the frequency and power of the low frequency bias generator is configured to increase the energy or number of ions and radicals arriving on the horizontal plane of the wafers while keeping constant or decreasing on the vertical plane. This may allow for the creation of different properties of one continuous film depending on its face in a three-dimensional structure by geometrically modulating the plasma treatment.

Some embodiments of the processing chamber 500 include a controller 595. The controller 595 may be provided and coupled to various components of the processing chamber 500 to control the operation thereof. The controller 595 can be a single controller that controls the entire processing chamber 500, or multiple controllers that control individual portions of the processing chamber 500. In some embodiments, the controller 595 includes a central processing unit (CPU) 596, memory 597, support circuits 598 and an input/output (I/O) 599. The controller 595 may control the processing chamber 500 directly, or via computers (or controllers) associated with particular process chamber and/or support system components. The controller 595 may be one of any form of general-purpose computer processor that can be used in an industrial setting for controlling various chambers and sub-processors. The memory 597 or computer readable medium of the controller 595 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 598 are coupled to the CPU 596 for supporting the processor in a conventional manner. These circuits include cache, power supplies, clock circuits, input/output circuitry and subsystems, and the like. One or more processes may be stored in the memory 597 as software routine that may be executed or invoked to control the operation of the processing chamber 500 or individual processing chambers in the manner described herein. The software routine may also be stored and/or executed by a second CPU (not shown) that is remotely located from the hardware being controlled by the CPU 596. The input/output 599 can include keyboards, computer mice, displays and/or printers.

In some embodiments, the controller 595 is coupled to the susceptor assembly 140 and the gas distribution assembly 120. The controller 595 of some embodiments has one or more configurations to control the various functions and processes. In some embodiments, the controller 595 is also connected to main deposition generator 510 and low frequency bias generator 540 to control the functioning thereof. In some embodiments, the configurations are selected from a first configuration to rotate the susceptor assembly around the central axis, a second configuration to control flows of gases into each of the processing regions, a third configuration to control power to the main deposition generator and a fourth configuration to control power to the low frequency bias generator.

One or more embodiments of the disclosure are directed to methods for selectively depositing a dielectric film on the sidewall of a 3D structure. A bias hardware set up can enable directional plasma treatment. Some embodiments are directed to a selective horizontal plane deposition by changing the gas composition during the plasma treatment.

Figure 17:
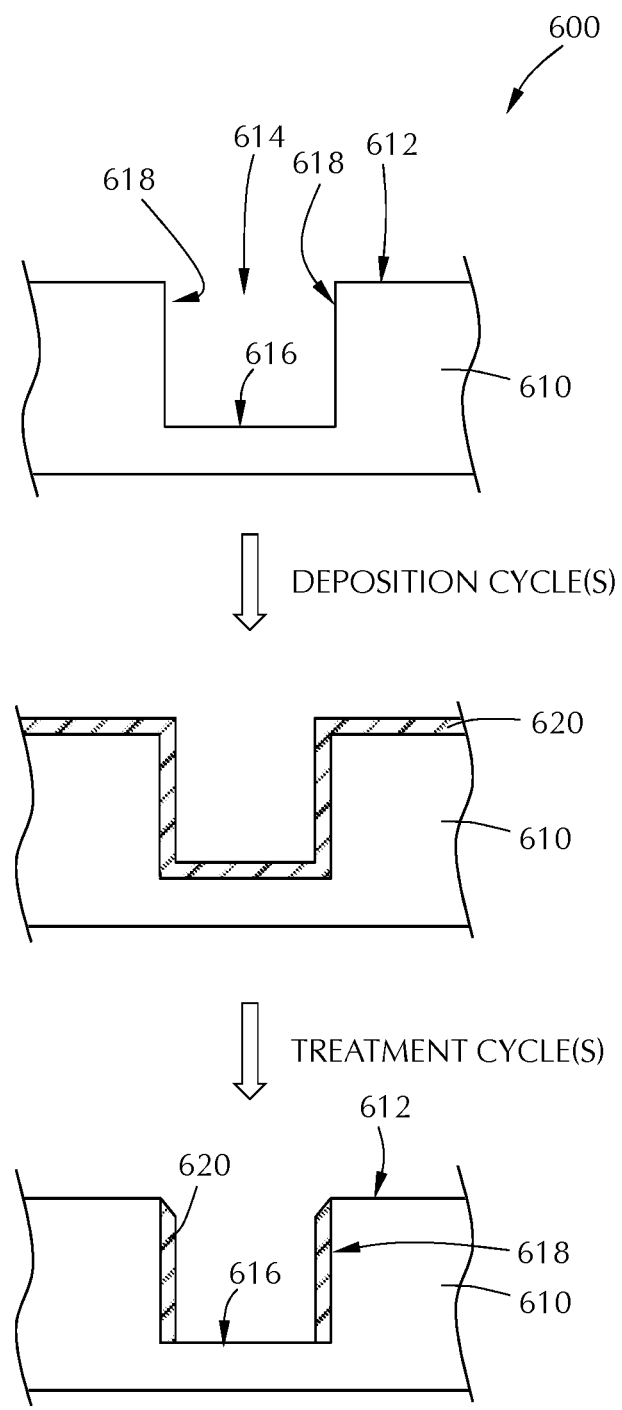
FIG. 17 shows an exemplary processing method using the apparatus of one or more embodiments of the disclosure.

Referring to FIGS. 15 and 17, some embodiments of the disclosure are directed to methods 600 of depositing a film. At least one substrate is positioned on a top surface of a susceptor assembly. The substrate 610 has a surface 612 with at least one feature 614 formed therein. The feature 614 extends a depth from the surface 612 to a bottom 616 and has sidewalls 618. The width of the feature can be any suitable width and the depth of the feature can be any suitable depth.

Flows of gases are provided into a plurality of processing regions in the processing chamber. Power is provided to the main deposition generator 510 to form a plasma in the plasma processing region 525. A low frequency bias generator 540 is powered to provide a low frequency bias to the susceptor assembly 140. In some embodiments, the flow of reactive gases to the thermal processing regions is stopped while the low frequency bias is applied to the susceptor assembly 140.

The substrate surface can be exposed to a first number of deposition cycles followed by a second number of treatment cycles. Each deposition cycle comprises exposing the substrate surface to a first reactive gas in a first processing region of the processing chamber, moving the substrate surface from the first processing region through a gas curtain to a second processing region, exposing the substrate surface to a second reactive gas in the second processing region, moving the substrate surface from the second processing region through a gas curtain to a plasma processing region, and exposing the substrate surface to a plasma process in the plasma processing region. Each of the treatment cycles includes, providing a low frequency bias to the susceptor assembly, and exposing the substrate surface to a biased plasma process in a biased plasma processing region using a main frequency plasma generated with a main deposition generator with the low frequency bias applied to the susceptor assembly. In some embodiments, the treatment cycle further comprises stopping a flow of the first reactive gas in the first processing region and the second reactive gas in the second processing region. In some embodiments, the biased plasma processing region is the same as the plasma processing region.

The first number of deposition cycles can be any suitable number. In some embodiments, the first number of deposition cycles is in the range of about 1 to about 500, or in the range of about 10 to about 250. In some embodiments, the first number of deposition cycles is about 100. The second number of treatment cycles can be in the range of about 1 to about 50. In some embodiments, only one treatment cycle is used depending on the number of deposition cycles.

Figure 16:
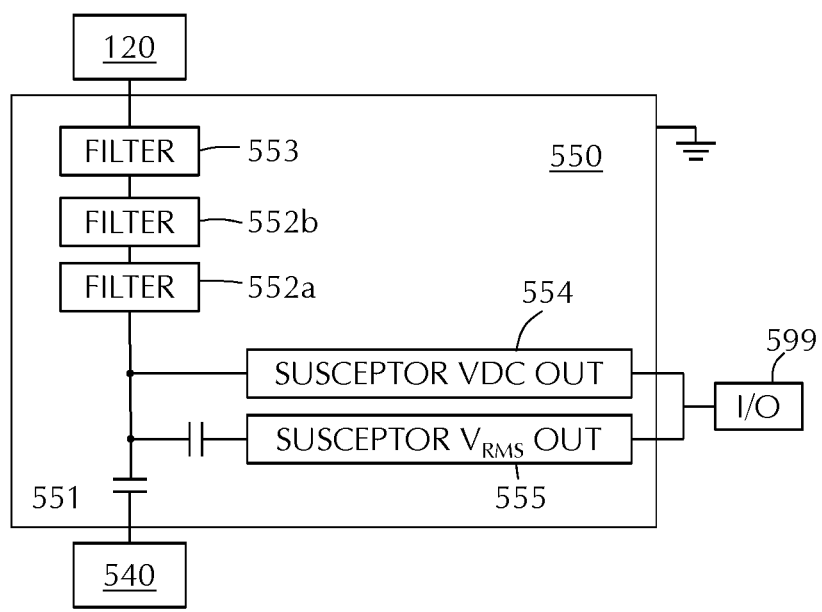
FIG. 16 shows a schematic view of an interface box in accordance with one or more embodiment of the disclosure.

Referring to FIGS. 5 and 16, an exemplary process is described. The first 250*a* and fifth 250*e* process regions are configured to deliver a first reactive gas. The second 250*b* and sixth 250*f* process regions are configured to deliver a second reactive gas. The third 250*c* and seventh 250*g* process regions are configured to deliver a purge gas. The fourth 250*d* and eighth 250*h* process regions are configured with a plasma treatment with the main deposition generator 510. The substrates are rotated around the central axis of the susceptor assembly to expose the substrate to multiple cycles to deposit a film 620 on the top surface of the substrate, sidewalls and bottom of the feature.

The flow of reactive gases to the first 250*a*, second 250*b*, fifth 250*e* and sixth 250*f* process regions can be stopped and a purge gas can be flowed. The purge gas may be flowed constantly in these (or other) sections with the reactive gas added to the purge gas flow. The low frequency bias generator 540 can be powered to apply a low frequency bias to the susceptor assembly 140 and the substrates can be exposed to at least one cycle of treatment. One cycle of treatment is one exposure to the plasma processing region, not a complete cycle around the processing chamber which would be two exposures. The treatment process removes the film 620 from the substrate surface 612 and the bottom 616 of the feature 614, leaving the film 620 on the sidewalls 618 of the feature 614. The composition of the treatment plasma can be the same as the composition of the deposition plasma or different. In some embodiments, the composition of the treatment plasma comprises one or more of Ar, He, $N_2$, $H_2$ or $NH_3$. In some embodiments, the treatment plasma composition is different than the deposition plasma composition.

EXAMPLES

A point of reference (POR) sample was made by a continuous film deposition of ~400 Å SiN without applying bias. The treated (Trt) samples underwent 50 times loop consisting of a ~5 Å SiN film deposition step (with or without bias) and a treatment step applying bias. These deposition-treatment steps were done continuously in the same chamber by switching the gas mixture from $Ar/N_2$ during the deposition step to $Ar/NH_3$ during the treatment.

Without being bound by theory, it is believed that the treatment process induces plasma damage to the film that increases their etch rate (ER). The directionality of the plasma treatment was enhanced by applying bias so that the top and bottom films in three-dimensional structures are more easily removed off by a subsequent etch process than on their sidewall, leaving the film selectively on the sidewall. In order to maximize the plasma treatment efficiency, the plasma treatment was periodically applied during the deposition. The frequency of the treatment (or thickness of the film between each deposition step) can be determined by plasma penetration depth, typically a few tens of angstroms.

The wet etch rate (in dilute 1:100 HF) (WER) of the treated films (normalized to that of the POR film) was evaluated. As the bias power was increased, the WER of the treated films increased sharply and reached more than 40× that of the POR sample, The WER appeared to saturate at power above about 50 W which may be useful for process repeatability.

A deposition-treatment SiN film was processed on a structured wafer with a feature with an aspect ratio (AR) 4-5:1. TEM images showed that the structures were uniformly covered by the SiN film in the as processed sample. The films on the sidewall of the structures selectively remained after 1 min etch while those on the top and bottom of the structures were etched away The selective sidewall deposition process was extended to a selective "horizontal plane deposition" by changing the gas composition during the deposition and treatment steps. An Ar/$NH_3$ plasma was used during the deposition process, leading to a low quality (high WER) film. The film was treated with Ar/$N_2$ plasma by applying LF bias during the treatment part. The Ar/$N_2$ treatment improved the film property (low WER) resulting in SiN films remained selectively on the horizontal planes after a subsequent wet etch process. The treatment cycle were performed after deposition of about 5 Å.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura and the Endura both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:
1. A processing chamber comprising:
a susceptor assembly having a top surface and a central axis to rotate a plurality of substrates positioned on the top surface around the central axis of the susceptor assembly;
a gas distribution assembly comprising a plurality of processing regions, each processing region separated from adjacent processing regions by a gas curtain, at least one of the processing regions comprises a plasma processing region with a main deposition generator operating at a main deposition generator frequency; and
a low frequency bias generator electrically connected to the susceptor assembly through an interface box to apply a low frequency bias to the susceptor assembly, the interface box comprising a DC blocking capacitor for DC isolation of the susceptor assembly.

2. The processing chamber of claim 1, wherein the low frequency bias generator has a frequency of about 325 kHz.

3. The processing chamber of claim 1, wherein the interface box comprises at least one RF filter to block harmonics of the main deposition generator frequency.

4. The processing chamber of claim 1, wherein the interface box comprises at least one low-pass filter to block frequencies above the low frequency.

5. The processing chamber of claim 1, wherein the main deposition generator frequency is about 13.56 MHz.

6. The processing chamber of claim 1, wherein the plasma processing region generates a remote plasma.

7. The processing chamber of claim 6, wherein the plasma processing region comprises a vertical plasma source with an RF hot electrode and a return electrode positioned a distance above the top surface of the susceptor assembly.

8. The processing chamber of claim 1, wherein the plasma processing region generates a direct plasma.

9. The processing chamber of claim 8, wherein the main deposition generator applies power to the gas distribution assembly and the susceptor assembly acts as a return electrode, the main deposition generator applying sufficient energy to ignite a plasma in the plasma processing region and not ignite a plasma in non-plasma processing regions.

10. The processing chamber of claim 1, further comprising a controller connected to the susceptor assembly, gas distribution assembly, main deposition generator and low frequency bias generator to control functioning thereof.

11. The processing chamber of claim 10, wherein the controller has one or more configurations to control functions of the processing chamber, the one or more configurations selected from a first configuration to rotate the susceptor assembly around the central axis, a second configuration to control flows of gases into each of the processing regions, a third configuration to control power to the main deposition generator and a fourth configuration to control power to the low frequency bias generator.

12. A processing chamber comprising:
a susceptor assembly having a top surface and a central axis to rotate a plurality of substrates positioned on the top surface around the central axis of the susceptor assembly;
a gas distribution assembly comprising a plurality of processing regions, each processing region separated from adjacent processing regions by a gas curtain, at least one of the processing regions comprises a plasma processing region with a main deposition generator operating at a main deposition generator frequency, wherein the plasma processing region comprises a vertical plasma source with an RF hot electrode and a return electrode positioned a distance above the top surface of the susceptor assembly and generates a remote plasma; and
a low frequency bias generator electrically connected to the susceptor assembly to apply a low frequency bias to the susceptor assembly.

13. The processing chamber of claim 12, wherein the low frequency bias generator is connected to the susceptor assembly through an interface box, the interface box comprises a DC blocking capacitor for DC isolation of the susceptor assembly.

14. The processing chamber of claim 13, wherein the interface box comprises at least one RF filter to block harmonics of the main deposition generator frequency and at least one low-pass filter to block frequencies above the low frequency.

15. The processing chamber of claim 12, wherein the main deposition generator applies power to the gas distribution assembly and the susceptor assembly acts as a return electrode, the main deposition generator applying sufficient energy to ignite a plasma in the plasma processing region and not ignite a plasma in non-plasma processing regions.

16. The processing chamber of claim 12, further comprising a controller connected to the susceptor assembly, gas distribution assembly, main deposition generator and low frequency bias generator to control functioning thereof, the controller having one or more configurations to control functions of the processing chamber, the one or more configurations selected from a first configuration to rotate the susceptor assembly around the central axis, a second configuration to control flows of gases into each of the processing regions, a third configuration to control power to the main deposition generator and a fourth configuration to control power to the low frequency bias generator.

17. A processing chamber comprising:
a susceptor assembly having a top surface and a central axis to rotate a plurality of substrates positioned on the top surface around the central axis of the susceptor assembly;
a gas distribution assembly comprising a plurality of processing regions, each processing region separated from adjacent processing regions by a gas curtain, at least one of the processing regions comprises a plasma processing region with a main deposition generator operating at a main deposition generator frequency, wherein the at least one of the processing regions generates a direct plasma and the main deposition generator applies power to the gas distribution assembly and the susceptor assembly acts as a return electrode, the main deposition generator applying sufficient energy to ignite a plasma in the plasma processing region and not ignite a plasma in non-plasma processing regions; and
a low frequency bias generator electrically connected to the susceptor assembly to apply a low frequency bias to the susceptor assembly.

18. The processing chamber of claim 17, wherein the low frequency bias generator is connected to the susceptor assembly through an interface box, the interface box comprising a DC blocking capacitor for DC isolation of the susceptor assembly, at least one RF filter to block harmonics of the main deposition generator frequency and at least one low-pass filter to block frequencies above the low frequency.

19. The processing chamber of claim 17, wherein the main deposition generator frequency is about 13.56 MHz.

20. The processing chamber of claim 17, further comprising a controller connected to the susceptor assembly, gas distribution assembly, main deposition generator and low frequency bias generator to control functioning thereof, the controller having one or more configurations to control functions of the processing chamber, the one or more configurations selected from a first configuration to rotate the susceptor assembly around the central axis, a second configuration to control flows of gases into each of the processing regions, a third configuration to control power to the main deposition generator and a fourth configuration to control power to the low frequency bias generator.

* * * * *